(12) United States Patent
Lee et al.

(10) Patent No.: US 8,687,145 B2
(45) Date of Patent: Apr. 1, 2014

(54) ORGANIC ELECTROLUMINESCENT DEVICE AND METHOD FOR FABRICATING THE SAME

(75) Inventors: Yeon Keun Lee, Daejeon (KR); Dae Hee Lee, Daejeon (KR); Moon Soo Park, Daejeon (KR); Yun Hye Hahm, Daejeon (KR); Jung Bum Kim, Daejeon (KR); Mun Kyu Joo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/209,108

(22) Filed: Aug. 12, 2011

(65) Prior Publication Data

US 2012/0038876 A1  Feb. 16, 2012

(30) Foreign Application Priority Data

Aug. 13, 2010 (KR) ........................ 10-2010-0078399

(51) Int. Cl.
G02F 1/13357 (2006.01)
G02F 1/1335 (2006.01)
H01L 51/52 (2006.01)
H01L 51/54 (2006.01)

(52) U.S. Cl.
USPC ............... 349/65; 349/61; 349/175; 438/30

(58) Field of Classification Search
USPC ............... 257/E33.068, E33.074; 438/30; 349/175, 61, 65; 252/299.01
See application file for complete search history.

(56) References Cited

U.S. PATENT DOCUMENTS

| 2004/0160787 | A1 | 8/2004 | Takeuchi et al. |
| 2004/0246431 | A1* | 12/2004 | Asada ........................... 349/172 |
| 2004/0263061 | A1 | 12/2004 | Ishikawa et al. |
| 2005/0127822 | A1 | 6/2005 | Takeuchi et al. |
| 2006/0007552 | A1 | 1/2006 | Takakuwa et al. |
| 2006/0214572 | A1 | 9/2006 | Maeda |
| 2007/0096112 | A1 | 5/2007 | Hoshi |
| 2007/0141275 | A1 | 6/2007 | Hikmet |
| 2009/0051277 | A1* | 2/2009 | Inoue et al. ................... 313/504 |

FOREIGN PATENT DOCUMENTS

| JP | 2001-244080 | 9/2001 |
| JP | 2003-206485 | 7/2003 |
| JP | 2004-243199 A | 9/2004 |
| JP | 2005-063926 A | 3/2005 |
| JP | 2005-174701 A | 6/2005 |
| JP | 2006-023683 A | 1/2006 |
| JP | 2006-269328 | 10/2006 |
| JP | 2007-005277 A | 1/2007 |

(Continued)

OTHER PUBLICATIONS

Sun, Yiru and Forrest, Stephen R., "Enhanced light out-coupling of organic light-emitting devices using embedded low-index grids", Nature Photonics, Jul. 11, 2008, Princeton, New Jersey, USA.

*Primary Examiner* — Shean C Wu
(74) *Attorney, Agent, or Firm* — McKenna Long & Aldridge, LLP

(57) ABSTRACT

An exemplary embodiment of the present invention provides an organic electroluminescent device including a substrate, a first electrode, one or more organic material layers, and a second electrode in a sequentially deposited form, wherein a light scattering layer is provided between the substrate and the first electrode, and includes a cholesteric liquid crystal layer including a liquid crystal vertically aligned to the substrate, and a method for fabricating the same.

19 Claims, 6 Drawing Sheets

(56) References Cited

FOREIGN PATENT DOCUMENTS

| | | |
|---|---|---|
| JP | 2007-525580 | 9/2007 |
| KR | 10-0636579 | 1/2005 |
| KR | 10-2005-0118566 A | 12/2005 |
| KR | 10-2007-0030124 A | 3/2007 |

* cited by examiner

SUBSTRATE

SUBSTRATE

Example 1

Example 2

Example 3

ORGANIC ELECTROLUMINESCENT DEVICE AND METHOD FOR FABRICATING THE SAME

The application claims priority under 35USC 119(a) to Korean Patent Application No. 10-2010-0078399, filed in the Republic of Korea on Aug. 13, 2010, the entire content of which is incorporated herein by reference.

This application claims priority to and the benefit of Korean Patent Application No. 10-2010-0078399 filed in the Korean Intellectual Property Office on Aug. 13, 2010, the entire contents of which are incorporated herein by reference.

TECHNICAL FIELD

The present invention relates to an organic electroluminescent device and a method for fabricating the same. Particularly, the present invention relates to an organic electroluminescent device for preventing a loss of light due to a difference of refractive indexes between a transparent electrode and a substrate, and a method for fabricating the same.

BACKGROUND

An organic electroluminescent device is generally composed of two electrodes and one or more organic material layers that are disposed between the electrodes. In detail, the organic light emitting device may have the same structure as the structure shown in FIG. 1. In FIG. 1, 1 represents a substrate, 2 represents a first electrode, 3 represents an organic material layer and 4 represents a second electrode. In an organic electroluminescent device having the above structure, if a voltage is applied between the first electrode and the second electrode, a hole is introduced from the first electrode and an electron is introduced from the second electrode into the organic material layer. An exciton is formed by recombining the hole and the electron. A photon corresponding to a difference of energy is emitted while the exciton falls to a bottom state. By this principle, an organic electroluminescent device emits visible rays, and an information display diode or illumination diode may be manufactured by using this.

In general, an organic electroluminescent device may be manufactured by a method for depositing a first electrode on a substrate, depositing one or more organic material layers, and depositing a second electrode. Accordingly, in order to emit light generated in an organic material layer, an electrode in a direction of emitting light should be transparent. When light is emitted in a first electrode direction, a substrate as well as a first electrode should be transparent.

Unlike a display, in the case of an illumination requiring a wide light emitting area, in general, a structure in which light is emitted in a first electrode direction has been developed. Since there is a limit in technology for increasing electric conductivity of the transparent electrode, the transparent electrode of the organic electroluminescent device for illumination requires a metal auxiliary electrode. The reason is that formation of the metal auxiliary electrode on the first electrode is technically easier than formation of the metal auxiliary electrode on the second electrode.

As described above, in the case of an organic electroluminescent device in which light is emitted in the first electrode direction, light emitted in the organic material layer passes through the first electrode and the substrate and is emitted to the air. The substrate is generally formed of glass in which a blocking property of air and moisture is excellent, and the glass has a refractive index of about 1.5. On the other hand, it is known that an average refractive index of the organic material layer emitting light is about 1.8.

In general, when light progresses from a medium having a high refractive index to a medium having a low refractive index, light that is incident at a critical angle or more does not pass through and is totally reflected. Accordingly, in the case of an organic electroluminescent device, since the refractive index of the organic material layer in which light is generated is about 1.8, only light that is incident at a critical angle or less passes through the glass substrate having the refractive index of about 1.5, such that a great loss of light occurs. This phenomenon occurs even when light is emitted in the glass substrate to the air having the refractive index of 1.

An example of a loss of light due to a difference of the refractive indexes between the transparent electrode and the glass substrate of an organic electroluminescent device is illustrated in FIG. 3.

Accordingly, as described above, an external light extraction for improving an efficiency of an organic electroluminescent device by preventing light from being emitted from a transparent substrate to an air layer totally reflected in the transparent substrate, and lost in the loss of light generated at interfaces having different refractive indexes has been studied.

For example, Korean Unexamined Patent Application Publication Nos. 10-2005-0001364 and 10-2005-0118566, and Japanese Unexamined Patent Application Publication Nos. 2007-005277, 2006-023683, 2005-174701, 2005-063926, and 2004-253199 disclose a method for changing the surface of a flat glass substrate in order to prevent a loss of light generated at an interface between the glass substrate and air.

Efficiency of an organic electroluminescent device may be improved by significantly recovering light lost by total reflection in the organic substrate by the above method. However, this method has a limit in that an effect is limited to only light transmitted to a glass substrate in light emitted in an organic material layer. In order to transmit all light emitted in an organic material layer to a glass substrate, a refractive index interface between an organic material layer and a glass substrate may be removed by using a glass substrate having the refractive index of 1.8 or more, but this method is not suitable to mass production.

Various studies for internal light extraction for extracting light confined by the organic material layer in conjunction with the study for the above external light extraction have been made.

For example, Japanese Unexamined Patent Application Publication No. 2006-269328, Korean Unexamined Patent Application Publication No. 10-2007-0030124 and Nature Photonics 2, 483-487 (2008) disclose various methods with respect to internal light extraction for extracting light confined by an organic material layer.

In the case of the illumination using an organic electroluminescent device, a transparent substrate should be used. In consideration of mass production, recently, the refractive index of a transparent substrate may not greatly exceed 1.52.

On the other hand, since the refractive index of a transparent electrode or a organic material layer is about 1.8, which is high, in order to extract light confined when light progresses at a progress angle of a critical or more in a transparent electrode and organic material layer, a method for forming a layer that can perform refraction of the progress angle between a transparent electrode and a transparent substrate may be used. As described above, the layer that can perform refraction of a progress path between a transparent electrode and a transparent substrate may receive a greater quantity of light emitted in an organic material layer as similarity of the refractive index thereof to the refractive indexes of the transparent electrode and the organic material layer is increased. When an average scattering angle is increased, a possibility of not total reflecting light but transmitting light when light passes through a transparent substrate layer may be increased.

Japanese Unexamined Patent Application Publication No. 2006-269328 discloses a method for planarizing an uneven structure by a material having a similar refractive index to a organic material layer after the unevenness is formed in order to refract light in the glass substrate. However, the formation of the uneven structure that can exhibit a sufficient scattering effect on the glass substrate like the above method is technically difficult and it is difficult to obtain a high refractive material that can planarize the uneven structure. In the case of a generally shaped organic material, a refractive index is not high, and in the case of an inorganic material, there is a method for performing polishing after the inorganic material is excessively deposited, but this method is not effective for mass production. Another problem is that even though a sufficient scattering property of the substrate on which the unevenness is formed is exhibited, in the case where a planarization layer is formed by materials in which a refractive index difference is not large, the scattering property is largely decreased by half, such that it is difficult to obtain an expected performance. Technologies disclosed in other prior arts have a possibility in terms of conception, but it is difficult to apply the technologies for mass production in practice.

In particular, in the case of an organic electroluminescent device, since a very large light emitting area is necessary as compared to a light emitting diode, there is a larger limit in a process that can perform mass production.

SUMMARY

The present invention has been made in an effort to provide an organic electroluminescent device that can increase an efficiency of the organic electroluminescent device by preventing a loss of light due to a difference of refractive indexes between a transparent electrode and a substrate, and a method for fabricating the same.

An exemplary embodiment of the present invention provides an organic electroluminescent device including a substrate, a first electrode, one or more organic material layers, and a second electrode in a sequentially deposited form, wherein a light scattering layer is provided between the substrate and the first electrode, and includes a cholesteric liquid crystal layer including a liquid crystal vertically aligned to the substrate.

Another exemplary embodiment of the present invention provides a method for fabricating an organic electroluminescent device including a substrate, a first electrode, one or more organic material layers, and a second electrode in a sequentially deposited form, wherein the method further comprising forming a light scattering layer between the substrate and the first electrode, the light scattering layer comprising a cholesteric liquid crystal layer including a liquid crystal vertically aligned to the substrate. Since the light scattering layer has an internal scattering property but not has a surface unevenness, it is not necessary to form an unevenness on a surface. It is not necessary to perform a surface planarization operation before a transparent electrode and organic materials are deposited.

According to the exemplary embodiments of the present invention, it is possible to increase a light emitting efficiency of an organic electroluminescent device, in particular, an organic electroluminescent device used for illumination.

According to the exemplary embodiments of the present invention, it is possible to minimize a loss of light generated due to a difference of refractive indexes between a transparent electrode and a substrate by the light scattering layer.

DETAILED DESCRIPTION

Hereinafter, the present invention will be described in detail.

An organic electroluminescent device according to an exemplary embodiment of the present invention includes a substrate, a first electrode, one or more organic material layers, and a second electrode in a sequentially deposited form, wherein a light scattering layer is provided between the substrate and the first electrode and includes a cholesteric liquid crystal layer including a liquid crystal vertically aligned to the substrate.

Figure 1:
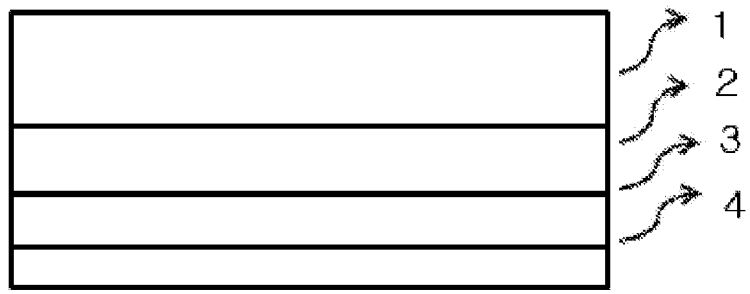
FIG. 1 illustrates an example of a known organic electroluminescent device.
Figure 2:
FIG. 2 illustrates an example of an organic electroluminescent device according to an exemplary embodiment of the present invention.
Figure 3:
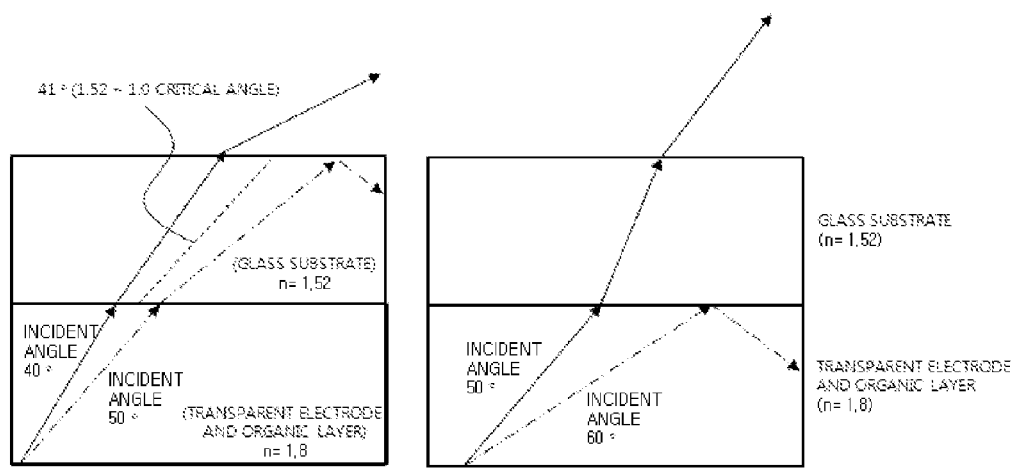
FIG. 3 illustrates an example of a loss of light generated due to a difference between refractive indexes of the organic material layer and the glass substrate according to the related art.

In detail, FIG. 2 illustrates an example of an organic electroluminescent device according to an exemplary embodiment of the present invention. In FIG. 2, reference numeral 1 represents a substrate, 10 represents a light scattering layer, 2 represents a first electrode, 3 represents an organic material layer and 4 represents a second electrode.

The substrate may be formed of a glass substrate having excellent mechanical strength, chemical resistance and light transmittance, but is not limited thereto.

The light scattering layer including the cholesteric liquid crystal layer is directly coated on the substrate may be provided on the substrate, or the light scattering layer including a base member and the cholesteric liquid crystal layer disposed on the base member may be provided on the substrate.

Since the above case is not a scattering manner by surface unevenness, it is not necessary to perform a planarization process after the cholesteric liquid crystal layer is formed on the substrate. The first electrode, the organic material layer and the second electrode may be directly formed after the cholesteric liquid crystal layer is formed.

In the processes for manufacturing the organic electroluminescent device, there is a merit in that a process for forming the light scattering layer is further performed. Accordingly, there is no cost burden by an addition process except for this.

In addition, there is a merit in that a haze is higher than that of a scattering layer by particle distribution, an internal loss by light absorption is small and a refractive index is high.

The light scattering layer may be directly coated on the substrate. In this case, there is a merit in that the organic electroluminescent device may be manufactured by a continuous process.

The light scattering layer may include the base member disposed on the substrate and the cholesteric liquid crystal layer disposed on the base member. In this case, the light scattering layer is manufactured by a separate process, and can be applied to the organic electroluminescent device according to the exemplary embodiment of the present invention.

The base member supports the cholesteric liquid crystal layer. The base member may be formed of a glass substrate or a plastic substrate such as polyethylene terephthalate, polycarbonate, triacetyl cellulose, polyacrylate, polyethylene, or cycloolefin polymer such as norbornene derivative.

In the case where the plastic substrate is used as the base member, in order to increase hydrophilicity of the surface of the substrate, it is preferable that hydrophilic treatment such as corona treatment or alkali treatment is performed. This is performed to improve an attachment property of an alignment film or cholesteric liquid crystal layer and the substrate as described later. If the hydrophilic treatment is performed on the surface of the member as described above, an end group having polarity of the alignment film or the cholesteric liquid crystal layer is fixed to the hydrophilic surface, and a hydrophobic alkyl chain is aligned in an opposite direction, such that vertical alignment is more effectively performed.

Figure 8:
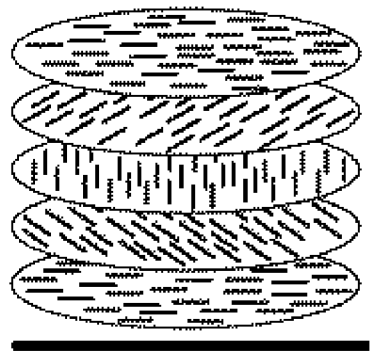
FIG. 8 illustrates a form of liquid crystal alignment for being compared to the form of liquid crystal alignment in a scattering layer used in the exemplary embodiment of the present invention.

The liquid crystal of the liquid crystal layer aligned horizontally to the substrate, as shown in FIG. 8, has a liquid crystal alignment shape.

Figure 7:
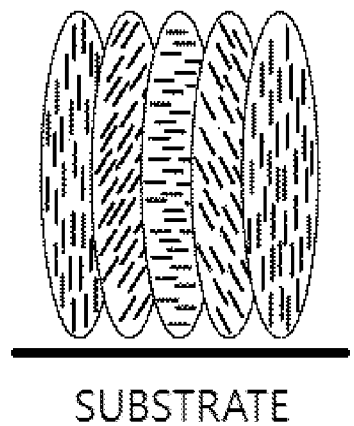
FIG. 7 illustrates a form of liquid crystal alignment in a scattering layer used in the exemplary embodiment of the present invention.

On the other hand, the liquid crystal of the cholesteric liquid crystal layer according to the exemplary embodiment of the present invention, as shown in FIG. 7, may include the liquid crystal vertically aligned to the substrate. In this case, the liquid crystal aligned according to the exemplary embodiment of the present invention is aligned while rotating, such that there are liquid crystals aligned in all directions from 0° to 360° to the substrate.

It is preferable that the cholesteric liquid crystal layer includes a liquid crystal in which a helix axis of the liquid crystal makes an acute angle with the substrate, and in particular, the cholesteric liquid crystal layer may include the liquid crystal in which a helix axis of the liquid crystal makes an angle of 0° to ±30° with the substrate. More preferably, the liquid crystal in which a helix axis of the liquid crystal makes an angle of 0° to ±15° with the substrate may be included.

In this case, according to the exemplary embodiment of the present invention, in the liquid crystal forming the cholesteric liquid crystal layer, the liquid crystal in which a helix axis of the liquid crystal makes an angle of 0° to ±30° with the substrate may be 50% or more and more preferably 70% or more.

The exemplary embodiment of the present invention may include 10% or more of liquid crystal of the cholesteric liquid crystal layer in which a helix axis of the liquid crystal aligned in parallel with the substrate (the case where the angle of the helix axis of the liquid crystal and the substrate is 0°). The exemplary embodiment of the present invention may include more preferably 15% or more of liquid crystal of the cholesteric liquid crystal layer in which a helix axis of the liquid crystal aligned in parallel with the substrate.

The cholesteric liquid crystal layer may be manufactured from the composition for forming the liquid crystal layer including i) a liquid crystal material, ii) a chiral dopant and iii) a solvent.

The liquid crystal material i) includes the liquid crystals in which an optical axis of a portion of the liquid crystals is aligned vertically to the substrate after alignment. In this case, the optical axis of the liquid crystal means a direction in which retardation does not occur with respect to prepolarized light in an incident direction.

The liquid crystal material i) may be a mixture including a liquid crystal monomer and a polymerization initiator. In addition, the liquid crystal monomer may include a reaction group that can perform photocuring or heat curing. The kind of the liquid crystal material i) is not particularly limited if the liquid crystal monomer is polymerized with an adjacent liquid crystal monomer by photo or heat polymerization initiator and a polymer in which a portion of the liquid crystal monomers are aligned in a vertical direction to the substrate is formed.

As the liquid crystal monomer that can be used in the exemplary embodiment of the present invention, for example, the liquid crystal monomers represented by the following Formula 1 to Formula 4 may be included, and these liquid crystal monomers may be used alone or in combination thereof. However, the liquid crystal monomer that can be used according to the exemplary embodiment of the present invention is not limited thereto. All kinds of liquid crystal monomers in which at least a portion of the liquid crystal materials forms a vertical alignment to the substrate or the helix axis of a portion of the liquid crystal materials makes an angle of 0° to 30° with the substrate and mixtures thereof may be used.

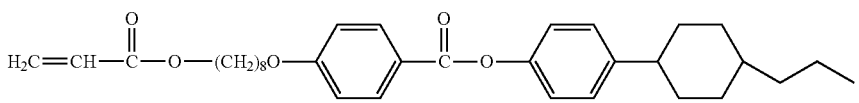

[Formula 1]

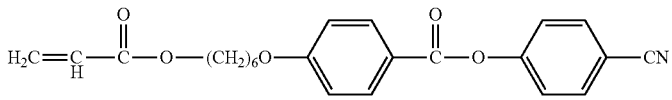

[Formula 2]

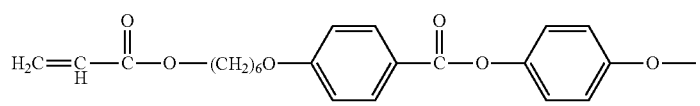
[Formula 3]

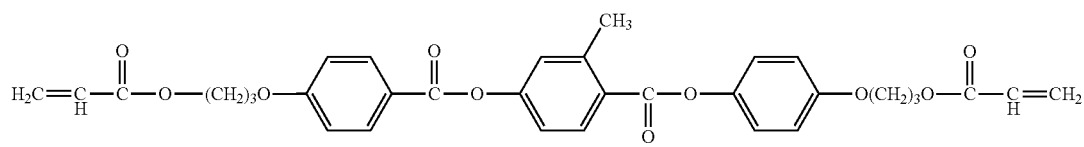
[Formula 4]

In this case, it is preferable that the content of the liquid crystal monomer is 80 to 99.5 parts by weight and the content of polymerization initiator is 0.05 to 20 parts by weight on the basis of 100 parts by weight of the liquid crystal material in the above liquid crystal material.

Meanwhile, the polymerization initiator initializes polymerization of the liquid crystal monomer, and any polymerization initiator known to the art may be used if there is no problem in compatibility between the polymerization initiator and the liquid crystal monomer.

For example, as the polymerization initiator according to the exemplary embodiment of the present invention, 2-methyl-1-[4-(methylthio)phenyl]-2-(4-morpholinyl)-1-propanone, 2-dimethoxy-1,2-diphenylethan-1-one, 1-hydroxycyclohexyl-phenyl-ketone, triaryl sulfonium hexafluoroantimonate salts and diphenyl(2,4,6-trimethylbenzoyl)-phosphine oxide may be used, and used alone or in a combination thereof. The examples are not limited thereto.

In this case, it is preferable that the content of the polymerization initiator is about 0.05 to 20 parts by weight on the basis of 100 parts by weight of the liquid crystal material. If the content of the polymerization initiator is less than 0.05 parts by weight, curing defect of the liquid crystal layer occurs, and if the content is more than 20 parts by weight, stains due to the liquid crystal alignment defects may be formed.

The chiral dopant ii) provides distortion to the liquid crystal alignment when the liquid crystal monomers are polymerized. When the helix axis of the aligned liquid crystal is not vertical but parallel to the substrate, a haze strongly occurs.

For example, the chiral dopant ii) may be LC756 manufactured by BASF, Co., Ltd. and S-811 manufactured by Merck, Co., Ltd.

In this case, it is preferable that the content of the chiral dopant is 0.001 to 20 parts by weight on the basis of 100 parts by weight of the liquid crystal material. If the content of the chiral dopant is less than 0.001 parts by weight, it is difficult to form the haze, and if the content is more than 20 parts by weight, a decrease of transmittance and stains due to vertical alignment defects of the liquid crystal may occur.

The solvent iii) is not particularly limited if the solvent can dissolve the liquid crystal material.

For example, in the exemplary embodiment of the present invention, one or more of halogenated hydrocarbons such as chloroform, dichloromethane, tetrachloroethane, trichloroethylene, tetrachloroethylene, and chlorobenzene;

aromatic hydrocarbons such as benzene, toluene, xylene, methoxybenzene, 1,2-dimethoxybenzene;

alcohols such as methanol, ethanol, propanol, isopropanol, acetone, methyl ethyl ketone, methyl isobutyl ketone, cyclohexanone, and cyclopentanone;

cellosolves such as methyl cellosolve, ethyl cellosolve, and butyl cellosolve; and ethers such as diethylene glycol dimethyl ether (DEGDME), dipropylene glycol dimethyl ether (DPGDME) may be used.

Meanwhile, the composition for forming the liquid crystal layer according to the exemplary embodiment of the present invention may further include a surfactant in addition to the above components. In the case where the surfactant is added to the composition for forming the liquid crystal layer, the surfactant is distributed on the surface of the liquid crystal and makes the surface even, and stabilizes the liquid crystal alignment, such that the film surface can be made smooth after the liquid crystal film is formed, and as a result thereof, an appearance quality of a liquid crystal film is improved.

For example, the surfactant is not limited thereto, but a fluorocarbon-based surfactant and/or a silicon-based surfactant may be used. As the fluorocarbon-based surfactant, Fluorad FC4430™, Fluorad FC4432™, and Fluorad FC4434™ manufactured by 3M, Co., Ltd., and Zonyl manufactured by Dupont, Co., Ltd. may be used. As the silicon-based surfactant, BYK™ manufactured by BYK-Chemie, Co., Ltd. may be used.

Meanwhile, it is preferable that the content of the surfactant is 0.01 to 5 parts by weight on the basis of 100 parts by weight of the liquid crystal material. If the content of the surfactant is less than 0.01 parts by weight, a surfactant addition effect is insufficient, and if the content is more than 5 parts by weight, micelle of the surfactant is generated, such that stains may be formed.

Figure 6:
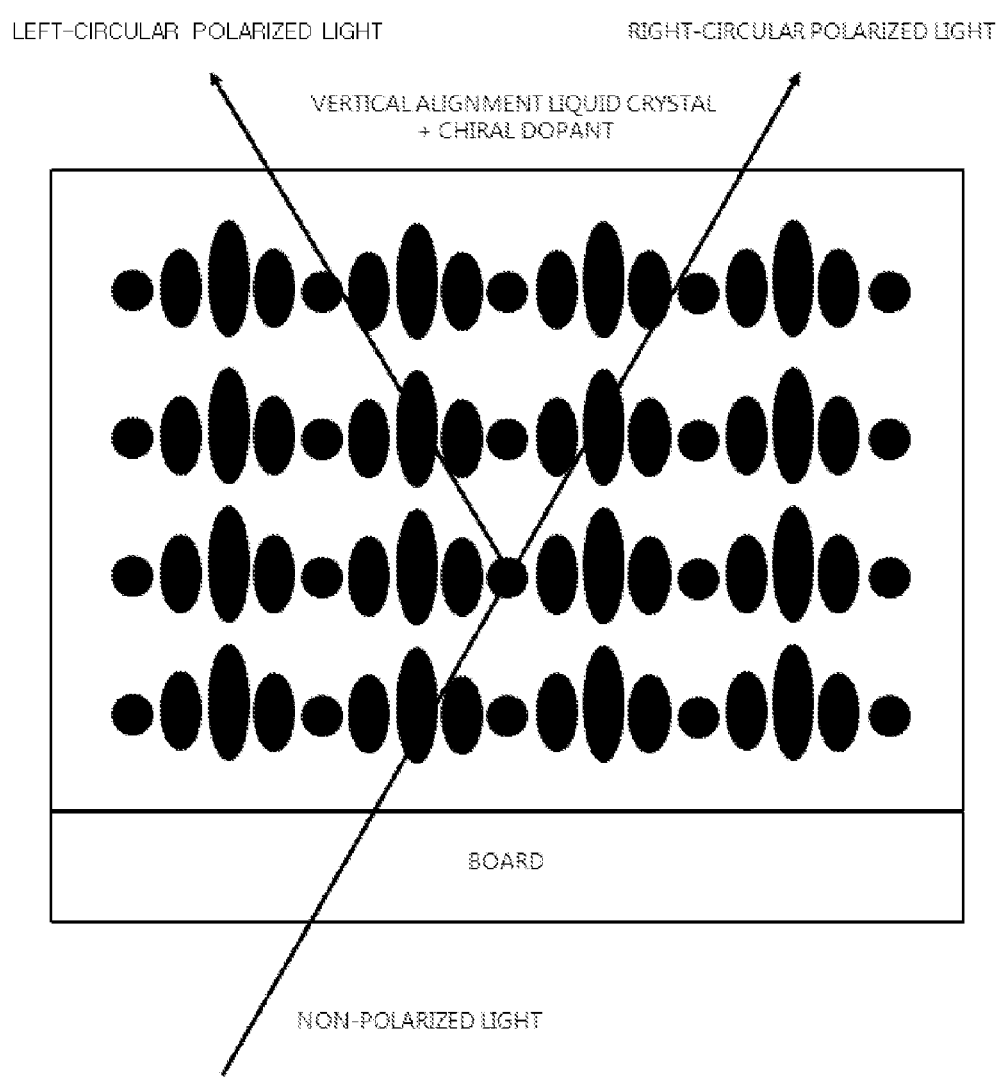
FIG. 6 illustrates an alignment structure of a cholesteric liquid crystal layer manufactured by using a composition for forming the liquid crystal layer according to the exemplary embodiment of the present invention.

FIG. 6 illustrates an alignment structure of a cholesteric liquid crystal layer manufactured by using a composition for forming the liquid crystal layer according to the exemplary embodiment of the present invention. As shown in FIG. 6, in the case where the cholesteric liquid crystal layer is formed by using the composition for forming the liquid crystal layer, the cholesteric liquid crystal alignment occurs in the cholesteric liquid crystal layer.

The cholesteric liquid crystal alignment means that a twisted direction of the helix structure of the liquid crystal is identical with a circular polarizing direction. If the liquid crystal is arranged in a cholesteric liquid crystal alignment, a selective reflection property is exhibited. The selective reflection property is that a circularly polarized light of a wavelength which is identical with a helix pitch is reflected. In this case, the wavelength of the reflected circularly polarized light is the same as [refractive index of the liquid crystal×pitch of the liquid crystal].

That is, in the case where the cholesteric liquid crystal layer is formed by using the composition for forming the liquid crystal layer, since the chiral dopant provides distortion to the liquid crystal alignment, the cholesteric liquid crystal alignment is formed. As a result, direction of the helix axis is vertical to the substrate. Furthermore, a property in which light is selectively reflected according to the pitch of the liquid crystal, that is, haze occurs.

Meanwhile, the haze value of the light scattering layer according to the exemplary embodiment of the present invention varies according to the thickness and the pitch of the liquid crystal layer. In the case where the liquid crystal layer is thin, the haze is weakly exhibited, and in the case where the liquid crystal layer is thick, the haze is thickly exhibited. In addition, when the liquid crystal layer has an appropriate pitch, the haze value tends to increase. By controlling the thickness and the pitch of the liquid crystal layer, it is possible to manufacture the light scattering layer having a desired haze.

In the liquid crystal layer, the haze is preferably 30% or more and more preferably 60% or more. In the case where the haze value is less than 30%, the internal light extraction efficiency may be decreased.

In general, if the haze value is increased, transmittance is decreased, such that since the upper limit of the haze value varies according to the condition, the upper limit is not limited.

The thickness of the liquid crystal layer is preferably 0.1 μm or more and more preferably 1 to 10 μm. Since a scattering phenomenon occurs in the liquid crystal layer, in the case where the thickness of the liquid crystal layer is less than 0.1 μm, it may be difficult to obtain a sufficient scattering property. In addition, in the case where the thickness of the liquid crystal layer is more than 10 μm, the light extraction efficiency may be decreased due to a loss by absorption of light in the light scattering layer.

Figure 5:
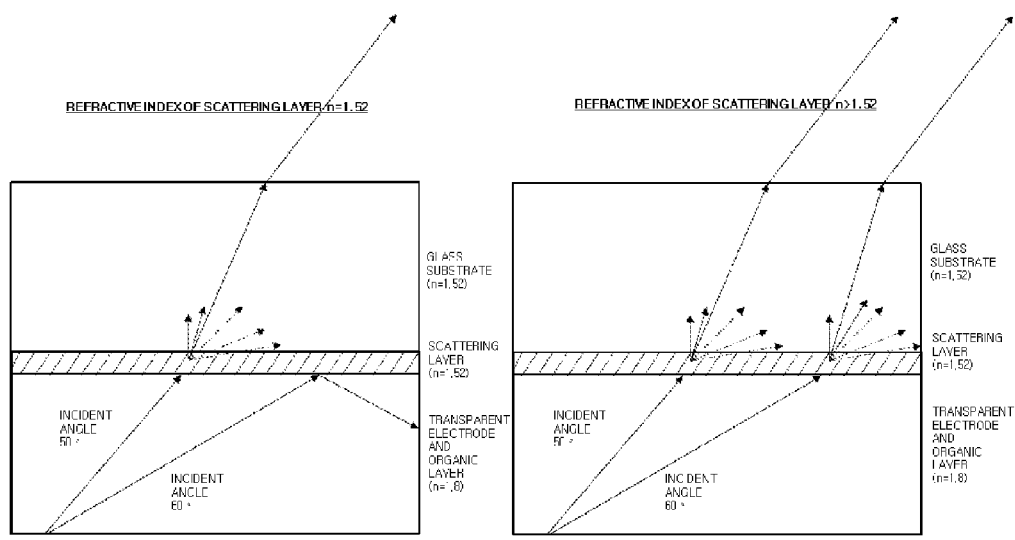
FIG. 5 compares losses of light generated in the case where a light scattering layer having a predetermined refractive index or less is used and the case where a light scattering layer having more than the predetermined refractive index is used.

The average refractive index of the liquid crystal layer is preferably above 1.52 μm and more preferably 1.55 to 2 μm. In the case where the average refractive index of the liquid crystal layer is 1.52 or less, as shown in FIG. 5, it is impossible to extract the incident light at a predetermined critical angle or more that is totally reflected. When as much light as possible in light generated in the organic material light emitting layer approaches the light scattering layer, the internal light extraction efficiency may be increased. To this end, the refractive index of the liquid crystal layer is similar to the refractive index of the organic material layer or transparent electrode layer so that light totally reflected between the organic material layer and the light scattering layer is as less as possible.

Figure 4:
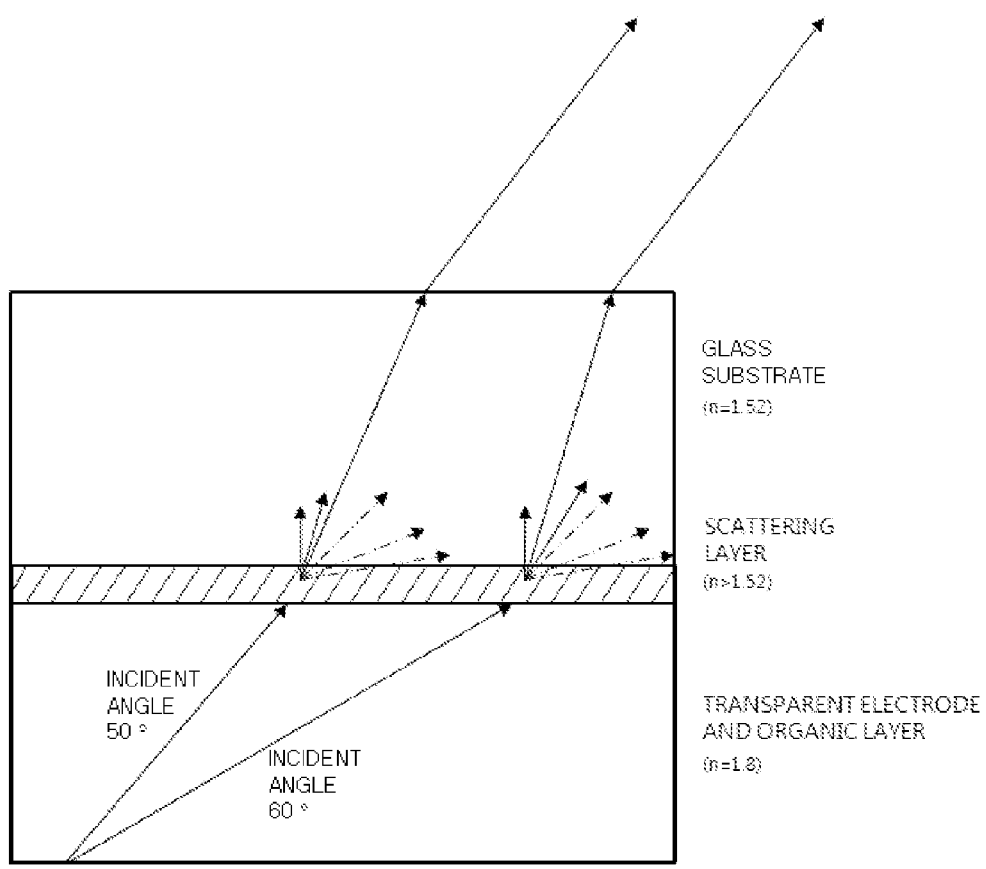
FIG. 4 illustrates an example of a constitution for preventing a loss of light generated from the organic material layer by including a light scattering layer between a substrate and a first electrode in the organic electroluminescent device according to the exemplary embodiment of the present invention.

FIG. 4 illustrates an example of a constitution for preventing a loss of light generated from the organic material layer by including a light scattering layer between a substrate and a first electrode in the organic electroluminescent device according to the exemplary embodiment of the present invention.

The cholesteric liquid crystal layer may be formed by directly coating the composition for forming the liquid crystal layer on the base member, or coating the composition for forming the liquid crystal layer on the alignment film after the alignment film is first formed on the base member.

The alignment film may include an organic material alignment agent such as recitin, trichlorosilane, trimethoxypropylsilane, hexadecyltrimethyl ammonium halide, alkyl carboxylato monochrome salt, or an inorganic material alignment agent such as $SiO_2$ or $MgF_2$.

The light scattering layer according to the exemplary embodiment of the present invention may be manufactured by a method for preparing the base member, coating the composition for forming the liquid crystal layer on the base member, and curing a film composition for forming the liquid crystal layer coated on the base member.

First, a glass substrate or plastic substrate is prepared as the base member. In this case, in the case of the plastic substrate, it is preferable that hydrophilic treatment such as corona treatment or alkali treatment is performed on the surface. This helps formation of the alignment helix axis of the liquid crystal in a horizontal direction to the substrate.

Thereafter, the composition for forming the liquid crystal layer according to the exemplary embodiment of the present invention is coated on the base member. The coating method of the composition for forming the liquid crystal layer is not particularly limited, but it is enough if the method can perform coating in a uniform thickness.

For example, spin coating, wire bar coating, gravure coating, dip coating, and spray coating methods, doctor blading, screen printing, or inkjet printing may be used. In this case, it is possible to obtain a desired haze value by controlling the coating thickness of the composition.

The composition for forming the liquid crystal layer is uniformly coated on the base member, and dried in order to remove the solvent. In general, methods such as room temperature drying, drying in a dry oven, and drying by heating may be used. After the solvent is evaporated, the cholesteric liquid crystal layer is fixed by curing the liquid crystal. In this case, the curing method may be largely divided into curing by light and curing by heat, and an appropriate curing method is selected and used according to the kind of liquid crystal.

Meanwhile, the manufacturing method according to the exemplary embodiment of the present invention, if necessary, may further a step for forming an alignment film on the base member before the composition for forming the liquid crystal layer is coated. The process for forming the alignment film is well known in the art, and the alignment film according to the exemplary embodiment of the present invention may be formed by the known methods. For example, the alignment film according to the exemplary embodiment of the present invention may be formed by a method for coating an alignment agent on the base member, drying and curing the base member, and rubbing or photoaligning the base member.

Another exemplary embodiment of the present invention provides a method for manufacturing an organic electroluminescent device including a substrate, a first electrode, one or more organic material layers, and a second electrode in a sequentially deposited form, wherein a light scattering layer is provided between the substrate and the first electrode, and includes a cholesteric liquid crystal layer including a liquid crystal vertically aligned to the substrate.

The method for manufacturing the organic electroluminescent device according to the exemplary embodiment of the present invention may be made by using a method and a material known in the art, except that the light scattering layer including the cholesteric liquid crystal layer including the liquid crystal aligned in a vertical direction between the substrate and the first electrode is formed.

For example, the organic light emitting device according to the present invention may be manufactured by forming an anode by depositing metal or metal oxides having the conductivity or an alloy thereof on a substrate by using a PVD (physical vapor deposition) method such as sputtering or e-beam evaporation, forming the organic material layer thereon, and depositing a material capable of being used as a cathode thereon. In addition to this method, in order to manufacture an organic electroluminescent device having the inverse structure, the organic electroluminescent device may be manufactured by sequentially depositing a cathode material, an organic material layer, and an anode material on a substrate.

In the organic electroluminescent device according to the exemplary embodiment of the present invention, the organic material layer may be manufactured in a smaller number of layer by using various polymer materials and by using not a deposition method but a solvent process, for example, spin coating, dip coating, doctor blading, screen printing, inkjet printing, heat transferring method and the like.

The organic material layer according to the exemplary embodiment of the present invention may be a laminate structure that includes a light emitting layer, and one or more selected from a hole injection layer, a hole transport layer, an electron transport layer, and an electron injection layer.

In the electrode of the organic electroluminescent device according to the exemplary embodiment of the present invention, the hole injection electrode material may be generally a material having a large work function so as to smoothly inject holes into the organic material layer. As detailed examples of the hole injection electrode material that can be used in the present invention, there are metal such as vanadium, chrome, copper, zinc, gold and the like or an alloy thereof; metal oxides such as zinc oxides, indium oxides, indium tin oxides (ITO), indium zinc oxides (IZO) and the like; a combination of metal and oxides such as ZnO:Al or $SnO_2$:Sb; and conductive polymers such as poly(3-methylthiophene), poly[3,4-(ethylene-1,2-dioxy)thiophene] (PEDT), polypyrrole, and polyaniline, but it is not limited thereto.

In the electrode of the organic electroluminescent device according to the exemplary embodiment of the present invention, the electron injection electrode material may be generally a material having a small work function so as to smoothly inject electrons into the organic material layer. As detailed examples of the electron injection electrode material, there are metal such as magnesium, calcium, sodium, potassium, titanium, indium, yttrium, lithium, gadolinium, aluminum, silver, tin, and lead or an alloy thereof; a multilayered structure material such as LiF/Al or $LiO_2$/Al, and the same material as the hole injection electrode material may be used, but they are not limited thereto.

The light emitting material of the light emitting layer is a material that receives the holes and the electrons from the hole transport layer and the electron transport layer, respectively, and combines them, such that light at a range of visible rays is emitted. It is preferable to use the material having excellent photon efficiency to fluorescence or phosphorescence.

As detailed examples thereof, there are a 8-hydroxy-quinoline aluminum complex (Alq3); a carbazole-based compound; a dimerized styryl compound; BAlq; 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene, and phosphorescent host CBP [[4.4'-bis(9-carbazolyl)biphenyl], but they are not limited thereto.

The light emitting material of the light emitting layer may further include a phosphorescent dopant or a fluorescent dopant in order to improve fluorescent or phosphorescent characteristics.

As detailed examples of the phosphorescent dopant, there are Ir(ppy)3[fac tris(2-phenylpyridine)iridium] or FIrpic[iridium(III)bis(4,6,-di-fluorophenyl-pyridinato-N,C2)picolinate]. As the fluorescent dopant, materials known in the art may be used.

The electron transport material is a material that receives the electrons from the electron injection electrode and transfers them to the light emitting layer, and the material having the large mobility to the electrons may be used. As detailed examples thereof, there are a 8-hydroxyquinoline Al complex; a complex including Alq3; an organic radical compound; a hydroxyflavone-metal complex and the like, but they are not limited thereto.

A better understanding of the present invention may be obtained in light of the following Examples which are set forth to illustrate, but are not to be construed to limit the present invention.

Preparation Example 1

Manufacturing of the Light Scattering Layer

The liquid crystal material that was formed of 30.8 parts by weight of liquid crystal monomer represented by Formula 1, 21.8 parts by weight of liquid crystal monomer represented by Formula 2, 21.8 parts by weight of liquid crystal monomer represented by Formula 3, 20.1 parts by weight of liquid crystal monomer represented by Formula 4, and 5.5 parts by weight of photoinitiator (Irgacure 907) was added to toluene so that the concentration of solid was 50 wt %. LC756™ manufactured by BASF, Co., Ltd. as the chiral dopant was added thereto in the concentration of 1 parts by weight of on the basis of the weight of the liquid crystal material. In addition, BYK300 (trade name, BYK-Chemie, Co., Ltd.) that was the silicon-based surfactant was added thereto in the concentration of 0.4 parts by weight on the basis of the total weight of the liquid crystal material. Thereafter, the composition for forming the liquid crystal layer was manufactured by heating the solution at 50° C. for 1 hour while the solution was agitated.

Thereafter, the light scattering layer including the liquid crystal layer was manufactured by coating the composition for forming the liquid crystal layer on the glass substrate having the size of 10×10 cm by using the spin coater at 1000 rpm for 10 sec, drying the composition on the hot plate at 150° C. for 30 sec, and UV curing the composition. In this case, the thickness of the liquid crystal layer in the light scattering layer was about 4.7 μm.

The transmission electron microscopic picture of the liquid crystal layer manufactured in Preparation Example 1 was obtained and transmittance and reflection ratio of the light scattering layer were measured by using the haze meter, and the results are described in the following Table 1.

Preparation Example 2

Manufacturing of the Light Scattering Layer

The light scattering layer was manufactured by performing the same manner as Preparation Example 1, except that LC756™ manufactured by BASF, Co., Ltd. was added in the concentration of 2 parts by weight on the basis of the weight of the liquid crystal material.

After the transmittance and reflection ratio of the light scattering layer manufactured in Preparation Example 2 were measured by using the haze meter, the results are described in the following Table 1.

Preparation Example 3

Manufacturing of the Light Scattering Layer

The light scattering layer was manufactured by performing the same manner as Preparation Example 1, except that LC756™ manufactured by BASF, Co., Ltd. was added in the concentration of 3 parts by weight on the basis of the weight of the liquid crystal material.

After the transmittance and reflection ratio of the light scattering layer manufactured in Preparation Example 3 were measured by using the haze meter, the results are described in the following Table 1.

Example 1

Manufacturing of the Organic Electroluminescent Device

The 2 stack white OLED (organic light emitting diode) having the light emitting region of 2×2 mm² was manufactured by laminating the light scattering layer manufactured in Preparation Example 1 on the 10×10 cm glass substrate, and sequentially forming from the IZO (indium zinc oxide) layer that was disclosed as No. 1 to the Al electrode layer that was disclosed as No. 13 in the following Table 1. In this process, the material generally used in the manufacturing field of the white OLED (organic light emitting diode) was used as the material of the HIL (hole injection layer), HTL (hole transfer layer), EML (emitting layer), ETL (electron transfer layer), CGL (charge generating layer), HBL (hole blocking layer) or EIL (electron injection layer), and a general method was used as the forming method thereof.

TABLE 1

|    |         | Laminate structure             | Thickness |
|----|---------|--------------------------------|-----------|
| 1  | IZO     | Electrode                      | 1000 Å    |
| 2  | HIL     | Hole injection layer           | 300 Å     |
| 3  | HTL     | Hole transfer layer            | 600 Å     |
| 4  | 1st EML | Red and Green light emitting layer | 1300 Å |
| 5  | ETL     | Electron transfer layer        | 150 Å     |
| 6  | CGL     | Charge generating layer        | 50 Å      |
| 7  | HIL     | Hole injection layer           | 300 Å     |
| 8  | HTL     | Hole transfer layer            | 350 Å     |
| 9  | 2nd EML | Blue light emitting layer      | 200 Å     |
| 10 | HBL     | Hole blocking layer            | 50 Å      |
| 11 | ETL     | Electron transfer layer        | 700 Å     |
| 12 | EIL     | Electron injection layer       | 15 Å      |
| 13 | Al      | Electrode                      | 1000 Å    |

The speed of light transmitted from the light emitting layer to the glass substrate was measured by using the integrating sphere after the hemisphere lens was attached to the surface of the manufactured organic electroluminescent device, and the result is described in the following Table 2.

Example 2

The organic electroluminescent device was manufactured by performing the same manner as Example 1, except that the light scattering layer manufactured in Preparation Example 2 was used instead of the light scattering layer.

The speed of light transmitted from the light emitting layer to the glass substrate was measured by using the integrating sphere after the hemisphere lens was attached to the surface of the manufactured organic electroluminescent device, and the result is described in the following Table 2.

Example 3

The organic electroluminescent device was manufactured by performing the same manner as Example 1, except that the light scattering layer manufactured in Preparation Example 3 was used instead of the light scattering layer.

The speed of light transmitted from the light emitting layer to the glass substrate was measured by using the integrating sphere after the hemisphere lens was attached to the surface of the manufactured organic electroluminescent device, and the result is described in the following Table 2.

Comparative Example 1

The organic electroluminescent device was manufactured by performing the same manner as Example 1, except that the light scattering layer was not applied.

TABLE 2

|                          | Example 1 | Example 2 | Example 3 | Comparative Example 1 |
|--------------------------|-----------|-----------|-----------|-----------------------|
| Transmittance (%)        | 90.9      | 89.2      | 82.5      | 91                    |
| Haze                     | 64        | 62.6      | 54.4      | 0                     |
| Speed of light (lm/1000) | 208       | 216       | 210       | 198                   |

Figure 9:
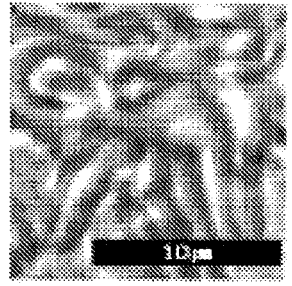
FIG. 9 shows the transmission microscope pictures of Examples 1, 2, and 3.
Figure 9:
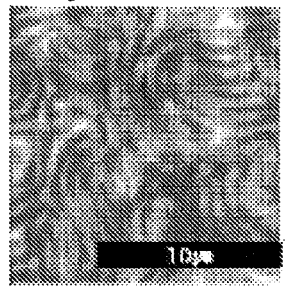
Figure 9:
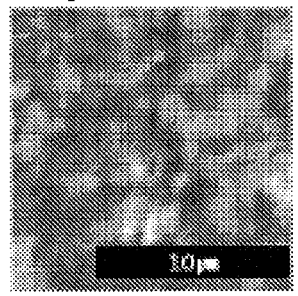

FIG. 9 shows the transmission microscope pictures of Examples 1, 2, and 3.

This is a content that the light scattering layer according to the exemplary embodiment of the present invention increases the quantity of light transmitted from the light emitting layer to the transparent substrate in the organic material layer, and from the above Table, the effect could be confirmed by measuring the speed of light approaching the transparent substrate.

What is claimed is:

1. An organic electroluminescent device comprising a substrate, a first electrode, one or more organic material layers, and a second electrode in a sequentially deposited form,
    wherein a light scattering layer is provided between the substrate and the first electrode,
    wherein the light scattering layer comprises a cholesteric liquid crystal layer including a liquid crystal in which a helix axis of the liquid crystal makes an acute angle with the substrate, and
    wherein a refractive index of the cholesteric liquid crystal layer is more than 1.52.

2. The organic electroluminescent device according to claim 1, wherein the cholesteric liquid crystal layer includes the liquid crystal in which a helix axis of the liquid crystal makes an angle equal to 0° or more and less than ±90° with the substrate.

3. The organic electroluminescent device according to claim 1, wherein the cholesteric liquid crystal layer has a haze value of 30% or more.

4. The organic electroluminescent device according to claim 1, wherein the cholesteric liquid crystal layer includes the liquid crystal in which a helix axis of the liquid crystal makes an angle of 0° to ±30° with the substrate.

5. The organic electroluminescent device according to claim 4, wherein the liquid crystal in which a helix axis of the liquid crystal makes an angle of 0° to ±30° with the substrate is 50% or more in the liquid crystal forming the cholesteric liquid crystal layer.

6. The organic electroluminescent device according to claim 1, wherein the light scattering layer includes a base member and the cholesteric liquid crystal layer disposed on the base member.

7. The organic electroluminescent device according to claim 1, wherein the cholesteric liquid crystal layer is manufactured from a composition including i) a liquid crystal material, ii) a chiral dopant and iii) a solvent.

8. The organic electroluminescent device according to claim 7, wherein i) the liquid crystal material includes a liquid crystal monomer and a polymerization initiator.

9. The organic electroluminescent device according to claim 8, wherein the liquid crystal monomer includes a reaction group that can perform photocuring or heat curing.

10. The organic electroluminescent device according to claim 7, wherein i) the liquid crystal material includes one or more selected from the liquid crystal monomers represented by the following Formula 1 to Formula 4:

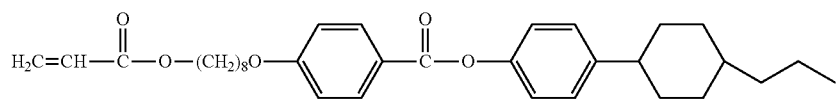

[Formula 1]

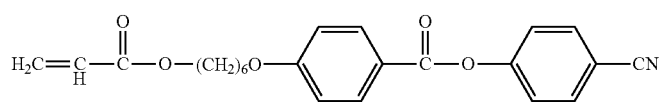

[Formula 2]

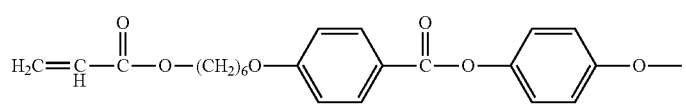

[Formula 3]

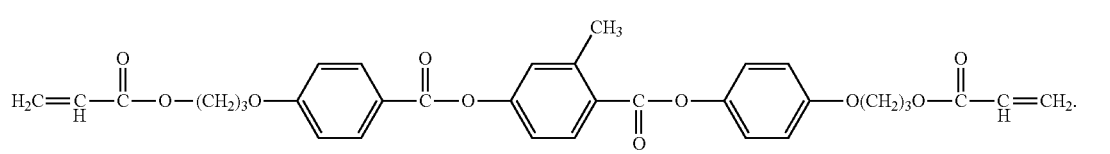

[Formula 4]

11. The organic electroluminescent device according to claim 8, wherein on the basis of 100 parts by weight of i) the liquid crystal material, a content of the liquid crystal monomer is 80 to 99.5 parts by weight and a content of the polymerization initiator is 0.05 to 20 parts by weight.

12. The organic electroluminescent device according to claim 7, wherein on the basis of 100 parts by weight of i) the liquid crystal material, a content of ii) the chiral dopant is 0.001 to 20 parts by weight.

13. The organic electroluminescent device according to claim 7, wherein the composition further includes a surfactant.

14. The organic electroluminescent device according to claim 13, wherein on the basis of 100 parts by weight of i) the liquid crystal material, a content of the surfactant is 0.01 to 5 parts by weight.

15. The organic electroluminescent device according to claim 6, wherein an alignment film is further included between the base member and the cholesteric liquid crystal layer.

16. The organic electroluminescent device according to claim 1, wherein a thickness of the cholesteric liquid crystal layer is 0.1 μm or more.

17. An organic electroluminescent device comprising a substrate, a first electrode, one or more organic material layers, and a second electrode in a sequentially deposited form,
wherein a light scattering layer is provided between the substrate and the first electrode,
wherein the light scattering layer comprises a cholesteric liquid crystal layer having a haze value of 30% or more, and
wherein a refractive index of the cholesteric liquid crystal layer is more than 1.52.

18. The organic electroluminescent device according to claim 17, wherein the cholesteric liquid crystal layer includes the liquid crystal in which a helix axis of the liquid crystal makes an angle of 0° to ±30° with the substrate.

19. The organic electroluminescent device according to claim 1, wherein the cholesteric liquid crystal layer is manufactured from a composition including i) a liquid crystal material, ii) a chiral dopant and iii) a solvent.

* * * * *